United States Patent
Dong et al.

(10) Patent No.: US 11,611,008 B2
(45) Date of Patent: Mar. 21, 2023

(54) MULTI-JUNCTION LAMINATED LASER PHOTOVOLTAIC CELL

(71) Applicant: SUZHOU INSTITUTE OF NANO-TECH AND NANO-BIONICS (SINANO), CHINESE ACADEMY OF SCIENCES, Suzhou (CN)

(72) Inventors: Jianrong Dong, Suzhou (CN); Yurun Sun, Suzhou (CN); Yongming Zhao, Suzhou (CN); Shuzhen Yu, Suzhou (CN)

(73) Assignee: SUZHOU INSTITUTE OF NANO-TECH AND NANO-BIONICS (SINANO), CHINESE ACADEMY OF SCIENCES, Suzhou (CN)

(*) Notice: Subject to any disclaimer, the term of this patent is extended or adjusted under 35 U.S.C. 154(b) by 0 days.

(21) Appl. No.: 17/428,640

(22) PCT Filed: Jun. 21, 2019

(86) PCT No.: PCT/CN2019/092185
§ 371 (c)(1),
(2) Date: Aug. 5, 2021

(87) PCT Pub. No.: WO2020/243998
PCT Pub. Date: Dec. 10, 2020

(65) Prior Publication Data
US 2022/0020890 A1 Jan. 20, 2022

(30) Foreign Application Priority Data
Jun. 3, 2019 (CN) .......................... 201910476086.8

(51) Int. Cl.
*H01L 31/0687* (2012.01)
*H01L 31/0693* (2012.01)
*H01L 31/0304* (2006.01)

(52) U.S. Cl.
CPC ...... *H01L 31/0687* (2013.01); *H01L 31/0693* (2013.01); *H01L 31/03046* (2013.01)

(58) Field of Classification Search
CPC ............. H01L 31/0687; H01L 31/0693; H01L 31/03046; H01L 31/0725; H01L 31/0735
See application file for complete search history.

(56) References Cited

U.S. PATENT DOCUMENTS 6,660,928 B1 * 12/2003 Patton ................. H01L 31/0687
136/249
2003/0070707 A1 * 4/2003 King ................. H01L 31/02168
136/255

(Continued)

FOREIGN PATENT DOCUMENTS

CA 3058490 A1 10/2018
CN 107093647 A 8/2017

(Continued)

OTHER PUBLICATIONS

CN 108735848 A English translaiton as provided by "Patent Translate Powered by EPO and Google", translated on Apr. 6, 2022.*

(Continued)

*Primary Examiner* — Golam Mowla
(74) *Attorney, Agent, or Firm* — Bayramoglu Law Offices LLC

(57) ABSTRACT

A multi junction laminated laser photovoltaic cell includes a cell unit laminated body and upper and lower electrodes electrically connected with the bottom and top of the cell unit laminated body, respectively, wherein the cell unit laminated body includes more than 6 laminated PN-junction subcells, adjacent two subcells are connected in series via tunnel junctions, wherein each PN-junction subcell uses a semiconductor single crystal material with a specific band gap as the absorption layer, the multiple subcells at least have two different band gaps, and the band gaps of the (Continued)

subcells are arranged in such an order that they decrease successively from the light incidence side to other side of the photovoltaic cell.

12 Claims, 4 Drawing Sheets

(56) References Cited

U.S. PATENT DOCUMENTS

| | | | |
|---|---|---|---|
| 2003/0145884 A1* | 8/2003 | King | H01L 31/0725 136/255 |
| 2004/0045598 A1* | 3/2004 | Narayanan | H01L 31/0687 257/E31.022 |
| 2004/0065363 A1* | 4/2004 | Fetzer | H01L 21/02502 257/E21.112 |
| 2004/0200523 A1* | 10/2004 | King | H01L 31/0687 136/262 |
| 2004/0206389 A1* | 10/2004 | Takamoto | H01L 31/0687 136/262 |
| 2005/0081910 A1* | 4/2005 | Danielson | H01L 31/0687 136/255 |
| 2005/0155641 A1* | 7/2005 | Fafard | B82Y 10/00 136/255 |
| 2005/0247339 A1* | 11/2005 | Barnham | H01L 31/0725 136/262 |
| 2006/0180198 A1* | 8/2006 | Takamoto | H01L 31/0504 438/74 |
| 2009/0078309 A1* | 3/2009 | Cornfeld | H01L 31/0693 438/93 |
| 2009/0078311 A1* | 3/2009 | Stan | H01L 31/0693 136/255 |
| 2012/0138116 A1* | 6/2012 | Bhusari | H01L 29/205 438/455 |
| 2012/0240987 A1* | 9/2012 | King | H01L 31/06875 438/57 |
| 2015/0380591 A1 | 12/2015 | Bett et al. | |
| 2017/0018675 A1 | 1/2017 | Meitl et al. | |
| 2018/0062020 A1 | 3/2018 | Fafard et al. | |
| 2020/0185559 A1* | 6/2020 | Fetzer | H01L 31/035272 |

FOREIGN PATENT DOCUMENTS

| | | |
|---|---|---|
| CN | 108735848 A | 11/2018 |
| JP | 2008177212 A | 7/2008 |
| WO | 2018232524 A1 | 12/2018 |

OTHER PUBLICATIONS

Yongming Zhao, et al., Design and fabrication of six-volt vertically-stacked GaAs photovoltaic power converter, Scientific Reports, 2016, pp. 1-9, 6:38044.

Mark C.A. York, et al., Challenges and strategies for implementing the vertical epitaxial heterostructure architechture (VEHSA) design for concentrated photovoltaic applications, Solar Energy Materials and Solar Cells, 2018, pp. 46-52, 181.

Mark C A York, et al., High efficiency phototransducers based on a novel vertical epitaxial heterostructure architecture (VEHSA) with thin p/n junctions, Journal of Physics D: Applied Physics, 2017, pp. 1-22, 50.

Meghan N. Beattie, et al., Optical Characterization of InAlGaAs on InP for Monochromatic Photonic Power Conversion, Photonics North, 2019.

Viktor M. Emelyanov, et al., Multijunction photovoltaic converters for information and power transmission systems, Journal of Physics: Conference Series, 2018, pp. 1-5, vol. 1135.

* cited by examiner

MULTI-JUNCTION LAMINATED LASER PHOTOVOLTAIC CELL

CROSS REFERENCE TO THE RELATED APPLICATIONS

This application is the national phase entry of International Application No. PCT/CN2019/092185, filed on Jun. 21, 2019, which is based upon and claims priority to Chinese Patent Application No. 201910476086.8, filed on Jun. 3, 2019, the entire contents of which are incorporated herein by reference.

TECHNICAL FIELD

The present application relates to a photovoltaic cell, particularly to a multi junction laminated laser photovoltaic cell, which is capable of converting target laser energy into electric energy, with a multi-band gap material as absorption layers.

BACKGROUND

A laser energy transfer system transmits light energy emitted from a laser source onto a far-end photovoltaic cell through optical fiber or a free space to convert light energy into electric energy so as to provide stable electric power output. Laser energy transfer has advantages over a traditional metal wire and coaxial cable power transmission technology, and can be applied to situations requiring for eliminating electromagnetic interference or isolating electronic devices from surrounding environment, and has important applications in radio communication, industrial sensors, national defense, aviation, medicines, energy sources and the like. The laser photovoltaic cell has a working principle similar to a solar cell, but can obtain higher conversion efficiency as it is for monochromatic sources.

III-V group semiconductors such as $Al_xGa_{1-x}As$ (x<0.45), InP and InGaAsP have direct band gaps and large absorption coefficients, can be used to absorb laser with a corresponding wavelength to be converted into electric energy. By taking an example of a GaAs material, the forbidden bandwidth $E_g$ at room temperature is 1.428 eV, the GaAs PN-junction cell can be used to convert laser of 700~850 nm into electric energy so it can be used as a photoelectric converter in a laser energy transmission system. The open-circuit voltage of the GaAs single-junction photovoltaic cell is about 1V, while the output voltage of the photovoltaic cell in the laser energy transmission system is generally required to be at least 5V or even more, a multi-junction laminated structure is usually grown on the GaAs or Ge conducting substrates to achieve high output voltages, and the open-circuit voltage of 23V has been obtained by using a 20-junction GaAs cell. However, when the junction number of the GaAs laminated cell converting 808 nm laser is 20, the thickness of the PN-junction absorption layer of the thinnest subcell is less than 40 nm. Preparation of such thin PN junction layers and accurate control of the thicknesses impose very strict requirements on the uniformity of the materials grown by metal organic chemical vapor deposition (MOCVD) or molecular beam epitaxy (MBE) technologies used for the cell structure growth, and making the fabrication of GaAs laser photovoltaic cell product with more than 20 junctions very difficult and even impossible.

SUMMARY

The main object of the present application is to provide a multi junction laminated laser photovoltaic cell to overcome the defects in the prior art.

In order to achieve the above object, the present application adopts the following technical solution:

An embodiment of the present application provides a multi junction laminated laser photovoltaic cell for converting laser energy into electric energy, comprising a cell unit laminated body as well as an upper electrode and a lower electrode respectively electrically connected with the bottom and top of the cell unit laminated body, wherein the cell unit laminated body comprises laminated N PN junction subcells, and adjacent two cells are connected in series via a tunnel junction, N≥6.

Further, a light absorption layer in the PN junction subcell comprises a base region and an emitter region, the base region and the emitter region have the same band gaps and have a first conducting type and a second conducting type, respectively, any one of the first conducting type and the second conducting type is n-type conducting type, and the other is p-type conducting type.

Further, the band gaps of the N PN junction subcells show a decreasing trend in a direction gradually away from the laser incidence side of the photovoltaic cell.

Preferably, the difference between the photon energy of the target laser and the band gap of the subcell at the laser incidence side of the photovoltaic cell is less than 0.1 eV.

In some embodiments, the subcell comprises a back surface field layer, a base region, an emitter region and a window layer which are successively arranged in a setting direction, the back surface field layer and the base region have a first conducting type, the emitter region and the window layer have a second conducting type, and none of the back surface field layer and the window layer absorbs incident target laser.

An embodiment of the present application also provides a method for fabricating the multi-junction laminated laser photovoltaic cell, comprising:

growing a cell unit laminated body on the front surface of a conducting substrate;

forming a dielectric film on the cell unit laminated body, and processing a window on the dielectric film exposing at least local region of the ohmic contact layer of the cell unit laminated body;

fabricating an upper electrode on the ohmic contact layer exposed from the window;

etching a region of the ohmic contact layer that is exposed from the window and not covered by the upper electrode until the current spreading layer of the cell unit laminated body is exposed; and fabricating a lower electrode on the back surface of the conducting substrate.

Compared with the prior art, since the multi-junction laser photovoltaic cell provided by the present application uses the multi-band gap material as the absorption layers, not only the multi-junction laminated cell is more flexible in structure design and easier to fabricating, but also the yield of the multi-junction cell can be improved, it has more significant effect especially for high-junction-number multi junction (12 junctions or more) laminated photovoltaic cell; meanwhile, after the multi-band gap material is adopted, the total thickness of the photovoltaic cell is obviously reduced,

DETAILED DESCRIPTION OF THE EMBODIMENTS

Figure 1:
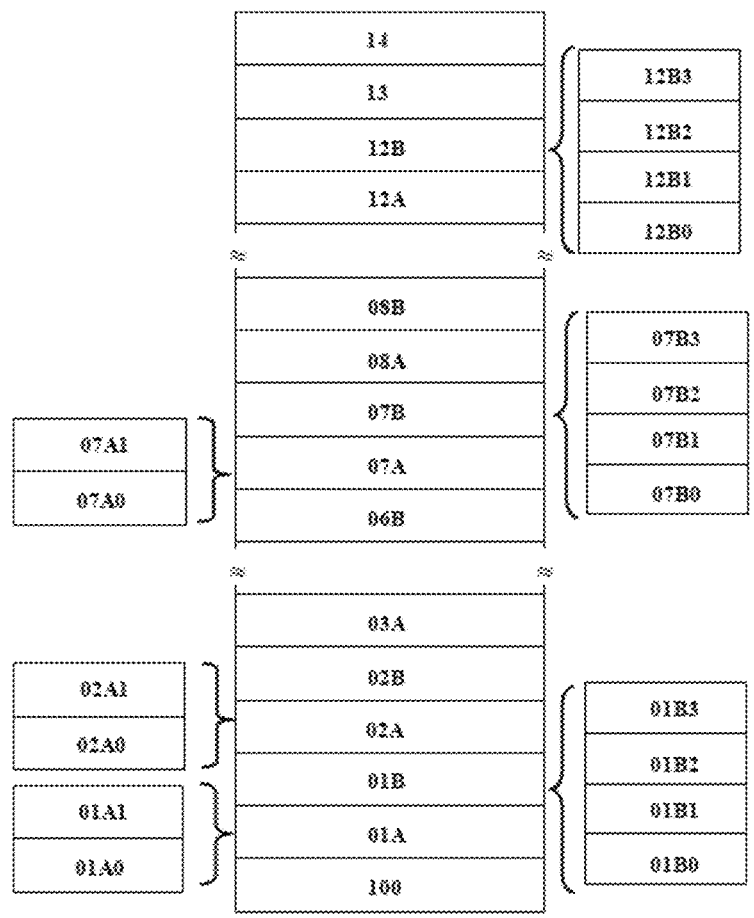
FIG. 1 shows a cross-sectional diagram of an epitaxial wafer of a multi-junction laminated laser photovoltaic cell in an embodiment of the present application.

To eliminate the defects in the prior art, the inventor of this case proposes the technical solution of the present application via long-term research and practice to be described in detail.

One aspect of the embodiment of the present application provides a photovoltaic cell, including a substrate, a cell unit laminated body, an upper electrode and a lower electrode, the lower electrode and the upper electrode are electrically connected with the bottom and the top of the cell laminated body, respectively, the cell unit laminated body includes an ohmic contact layer, a current spreading layer, laminated N PN junction subcells and a tunnel junction arranged between adjacent two subcells, N≥6.

Further, each PN junction subcell adopts a semiconductor single crystal material with a band gap as an absorption layer, multiple subcells at least have 2 different band gaps, band gaps in various subcells are arranged in a gradually decreasing sequence from the incident light side of the photovoltaic cell to the other side.

In some embodiments, the PN-junction subcell can include (Al)GaAs PN-junction subcell or InGaAsP PN-junction cell, and is not limited thereto.

In some embodiments, the light absorption layer in the PN junction subcell includes a base region and an emitter region which have the same band gaps and have a first conducting type and a second conducting type, respectively, any one of the first conducting type and the second conducting type is N-type conducting type, and the other is P-type conducting type.

For example, the PN junction subcell is an AlGaAs PN-junction subcell in which the light absorption layer includes a P-type $Al_xGa_{1-x}As$ base region and an N-type $Al_xGa_{1-x}As$ emitter region, $0 \leq x \leq 0.2$.

For example, the PN junction subcell is an InGaAsP PN junction subcell in which the light absorption layer includes an $In_{1-x}Ga_xAs_yP_{1-y}$ base region and an N-type $In_{1-x}Ga_xAs_yP_{1-y}$ emitter region, wherein, $0 \leq x \leq 0.53$ and $0 \leq y \leq 1$.

In some embodiments, the band gaps of the N PN-junction subcells show a decreasing trend in a direction gradually away from the laser incidence side of the photovoltaic cell, wherein the band gap of the subcell located at the laser incidence side is the most closest to the photon energy of the incident target laser.

Wherein, the laser incident side of the photovoltaic cell is one side where the light receiving surface is located.

Specifically, for the photovoltaic cell, the subcells are divided into at least two groups from the light incident side to the other side, and the groups of subcells have different band gaps and are arranged in an order of gradual decreasing ban gap.

By taking the photovoltaic cell being the AlGaAs multi junction laminated cell as an example, setting of the band gaps of one group of subcells at the light incident side should allow the band gap of $Al_{x1}Ga_{1-x1}As$ to be close to the photon energy of the incident laser, so that the absorption coefficient of $Al_{x1}Ga_{1-x1}As$ of the photon with this wavelength is on the order of $10^3$ cm$^{-1}$ order, and the thickness of the absorption layer of the thinnest top subcell is on the order $10^2$ nm. In such a way, the thinnest subcell is relatively easy to grow. More exactly, the design of x in $Al_xGa_{1-x}As$ is changed with the wavelength of incident laser, that is, the specific composition of $Al_xGa_{1-x}As$ is adjusted according to the wavelength of incident laser to meet the above requirements. For example, when the incident wavelength is 850~770 nm, x can be 0.02~0.14.

Also, by taking the photovoltaic cell being AlGaAs multi-junction laminated cell as an example, setting of the band gaps of one group of subcells at the light incident side should allow the band gap of $In_{1-x}Ga_xAs_yP_{1-y}$ to be close to the photon energy of the incident laser, so that the absorption coefficient of $In_{1-x}Ga_xAs_yP_{1-y}$ of the photon with this wavelength is on the order of $10^3$ cm$^{-1}$, and the thickness of the absorption layer of the thinnest top subcell is on the order of $10^2$ nm. In such a way, the thinnest subcell is relatively easy to grow. More exactly, the design of x and y in $In_{1-x}Ga_xAs_yP_{1-y}$ varied with the wavelength of incident laser, that is, the specific composition of $In_{1-x}Ga_xAs_yP_{1-y}$ is adjusted according to the wavelength of incident laser to meet the above requirements. For example, when the incident wavelength is 950~1550 nm, x and y can be 0.09~0.43 and 0.196~0.919, respectively.

Adoption of the above band gap not only can significantly increase the thickness of the absorption layer of the thinnest subcell in the multi junction cell so that the thinnest subcell in the multi-junction laminated cell is more easy to grow and control, but also the structure of the whole cell will not be very thick due to adoption of a single band gap material with a small absorption coefficient.

In some embodiments, the subcell comprises a back surface field layer, a base region, an emitter region and a window layer which are successively arranged in a setting direction, the back surface field layer and the base region have a first conducting type, the emitter region and the window layer have a second conducting type, and none of the back surface field layer and the window layer absorbs incident target laser.

For example, the PN-junction subcell is a $Al_xGa_{1-x}As$ PN-junction subcell which comprises a P-type back surface field layer, a P-type $Al_xGa_{1-x}As$ (x=x1, x2 . . . ) base region, an N-type $Al_xGa_{1-x}As$(x=x1, x2 . . . ) emitter region and an N-type window layer which are successively arranged in a setting direction, wherein none of the P-type back surface field later and the N-type window layer absorbs the incident target laser.

For example, the PN-junction subcell is an $In_{1-x}Ga_xAs_yP_{1-y}$ subcell which comprises a P-type back surface field layer, a P-type $In_{1-x}Ga_xAs_yP_{1-y}$ (x=x1, x2 . . . , y=y1, y2) base region, an N-type $In_{1-x}Ga_xAs_yP_{1-y}$ (x=x1, x2 . . . , y=y1, y2) emitter region and an N-type window layer which are successively arranged in a setting direction, wherein none of the P-type back surface field later and the N-type window layer absorbs the incident target laser.

In some embodiments, the bottom of the cell unit laminated body is electrically connected with the lower electrode via the conducting substrate.

Further, the conducting substrate can be preferably selected from conducting single crystal substrates. For example, the material of the conducting single crystal substrate can include GaAs, InP or Ge, but is not limited thereto.

In some embodiments, the cell unit laminated body is formed on the conducting substrate, and the subcell comprises a back surface field layer, a base region, an emitter region and a window layer which are successively arranged in a direction away from the conducting substrate, wherein none of the back surface field layer and the window layer can absorb the incident target laser.

Further, the conducting substrate preferably uses the conducting single crystal substrate, and the back surface field layer and the window layer are matched with the substrate lattices.

For example, the PN-junction subcell can be a AlGaAs subcell comprising a P-type $Al_{y1}Ga_{1-y1}As$ or P-type $Ga_{0.52}In_{0.48}P$ back surface field layer, a P-type $Al_xGa_{1-x}As$ base region, an N-type $Al_xGa_{1-x}As$ emitter region and an N-type $Al_{y2}Ga_{1-y2}As$ or N-type $Ga_{0.52}In_{0.48}P$ window layer which are successively arranged in a direction away from the conducting substrate, wherein the values of y1 and y2 should allow $Al_{y1}Ga_{1-y1}As$ and $Al_{y2}Ga_{1-y2}As$ not to absorb incident laser. In other words, y1 and y2 can be adjusted according to the wavelength of the incident laser, so as to change the specific compositions of $Al_{y1}Ga_{1-y1}As$ and $Al_{y2}Ga_{1-y2}As$ to meet the above requirements.

For example, the PN junction subcell can be an InGaAsP subcell comprising a P-type $(Al_{p1}Ga_{1-p1})_{0.47}In_{0.53}As$ or P-type InP back surface field layer, a P-type $In_{1-x}Ga_xAs_yP_{1-y}$ base region, an N-type $In_{1-x}Ga_xAs_yP_{1-y}$ emitter region and an N-type $(Al_{p2}Ga_{1-p2})_{0.47}In_{0.53}As$ or N-type InP window layer which are successively arranged in a direction away from the conducting substrate, wherein the values of p1 and p2 should allow $(Al_{p1}Ga_{1-p1})_{0.47}In_{0.53}As$ and $(Al_{p2}Ga_{1-p2})_{0.47}In_{0.53}As$ not to absorb incident laser. In other words, p1 and p2 can be adjusted according to the wavelength of the incident laser, so as to change the specific compositions of $(Al_{p1}Ga_{1-p1})_{0.47}In_{0.53}As$ and $(Al_{p2}Ga_{1-p2})_{0.47}In_{0.53}As$ to meet the above requirements.

In some embodiments, a current spreading layer and an ohmic contact layer are also successively arranged on the cell unit laminated body, the ohmic layer is electrically connected with the above upper electrode, and the current spreading layer does not absorb the incident target laser.

Wherein, the material of the ohmic layer includes but is not limited to GaAs or $In_{0.53}Ga_{0.47}As$.

In some embodiments, the conducting substrate uses an N-type substrate, the cell unit laminated body includes a first tunnel junction, a first subcell, . . . , Nth tunnel junction and Nth subcell, which are successively formed on the conducting substrate, wherein the tunnel junctions and the subcells are alternately arranged, and none of the first tunnel junction to Nth tunnel junction absorbs the incident target laser.

Wherein, the tunnel junction comprises an $N^+$-type semiconductor material layer and a $p^+$-type semiconductor material layer which are respectively connected with the N-type layer and the P-type layer of adjacent PN-junction subcell, and none of the $N^+$-type semiconductor material layer and the $p^+$-type semiconductor material layer absorbs the incident target laser.

Further, when the conducting type of the substrate is different from that of the bottom structure layer of the cell unit laminated body, a tunnel junction is also inserted between the substrate and the cell unit laminated body to convert the conducting type.

For example, the PN junction subcell can be a AlGaAs subcell, the cell unit laminated body includes a first funnel junction, a first $Al_xGa_{1-x}As$ subcell, . . . , a Nth tunnel junction and Nth $Al_xGa_{1-x}As$ subcell, which are successively formed on the conducting substrate, wherein the tunnel junctions and the subcells are alternately arranged, and none of the first tunnel junction to the Nth tunnel junction absorbs the incident target laser.

Wherein, the tunnel junction can comprise an $N^+$-type $Ga_{0.52}In_{0.48}P$ layer or $N^+$-type (Al)GaAs layer and a $P^+$-type (Al)GaAs layer which are successively arranged in a direction away from the conducting substrate, any one of the second tunnel junction to the Nth tunnel junction comprises an $N^+$-type $Ga_{0.51}In_{0.49}P$ or $N^+$-type $Al_{z1}Ga_{1-z1}As$ (z1>x) layer and a $P^+$-type $Al_{z2}Ga_{1-z2}As$ (z2>x) layer, wherein the values of z1 and z2 should allow $Al_{z1}Ga_{1-z1}As$ and $Al_{z2}Ga_{1-z2}As$ not to absorb incident laser. In other words, z1 and z2 can be adjusted according to the wavelength of the incident laser, so as to change the specific compositions of $Al_{z1}Ga_{1-z1}As$ and $Al_{z2}Ga_{1-z2}As$ to meet the above requirements.

For example, the PN-junction subcell can be an $In_{1-x}Ga_xAs_yP_{1-y}$ subcell, the cell unit laminated body includes the first tunnel junction, the first $In_{1-x}Ga_xAs_yP_{1-y}$ suncell, until the Nth tunnel junction and the Nth $In_{1-x}Ga_xAs_yP_{1-y}$ subcell, wherein the tunnel junctions and the subcells are alternately arranged, and noneof the first tunnel junction to the Nth tunnel junction absorbs incident laser. Wherein, the first tunnel junction can contain an $N^+$-type InP or $N^+$-type $(Al_{z1}Ga_{1-z1})_{0.47}In_{0.53}As$ layer and a $P^+$-type InP or $P^+$-type $(Al_{z2}Ga_{1-z2})_{0.47}In_{0.53}As$ layer which are successively arranged in a direction away from the conducting substrate, wherein the values of z1 and z2 should allow $(Al_{z1}Ga_{1-z1})_{0.47}In_{0.53}As$ and $(Al_{z2}Ga_{1-z2})_{0.47}In_{0.53}As$ not to absorb incident laser. In other words, z1 and z2 can be adjusted according to the wavelength of incident laser, so as to change the specific compositions of $(Al_{z1}Ga_{1-z1})_{0.47}In_{0.53}As$ and $(Al_{z2}Ga_{1-z2})_{0.47}In_{0.53}As$ to meet the above requirements.

In some embodiments, an N-type current spreading layer and an $N^+$-type ohmic contact layer are also successively formed on the Nth subcell, and the current spreading layer does not absorb incident target laser.

For example, the PN junction subcell can be a AlGaAs subcell, wherein an N-type $Ga_{0.51}In_{0.49}P$ or N-type $Al_{y3}Ga_{1-y3}As$ current spreading layer and an $N^+$-type $Al_{y3}Ga_{1-y3}As$ ohmic contact layer are also successively formed on the Nth AlGaAs subcell, wherein the value of y3 should allow the current spreading layer not to absorb incident laser. In other words, y3 can be adjusted according to the wavelength of the incident laser, so as to change the specific compositions of $Al_{y3}Ga_{1-y3}As$ to meet the above requirements.

In some another embodiments, the conducting substrate adopts a P-type substrate, the cell unit laminated body includes a first subcell, a first tunnel junction until a (N−1)th subcell, a (N−1)th tunnel junction and a Nth subcell which are successively formed on the conducting substrate, wherein the tunnel junctions and subcells are alternately arranged, and none of any one of the first tunnel junction~(N−1)th tunnel junction absorbs incident target laser.

For example, the PN junction subcell can be a AlGaAs subcell, the cell unit laminated layer includes a first $Al_xGa_{1-x}As$ subcell, a first tunnel junction until a (N−1)th $Al_xGa_{1-x}As$ subcell, a (N−1)th tunnel junction and a Nth $Al_xGa_{1-x}As$ subcell which are successively formed on the conducting substrate, wherein the tunnel junctions and subcells are alternately arranged, and noneof the first tunnel junction~ (N−1)th tunnel junction absorbs incident laser.

For example, the PN junction subcell can be an InGaAsP subcell, the photovoltaic cell includes a conducting single-crystal substrate (such as InP), multiple $In_{1-x}Ga_xAs_yP_{1-y}$ (x=x1, x2 . . . , y=y1, y2 . . . ) subcells, tunnel junctions among various subcells, a current spreading layer and an ohmic contact layer. Various subcells are connected in series through tunnel junctions.

Further, each of the first tunnel junction to (N−1)th tunnel includes an $N^+$-type layer and a $P^+$-type layer which are successively arranged in a direction away from the conducting substrate.

For example, each of the first tunnel junction to (N−1)th tunnel includes an $N^+$-type $Ga_{0.52}In_{0.48}P$ or $N^+$-type $Al_{z1}Ga_{1-z1}As$ layer and a $P^+$-type $Al_{z2}Ga_{1-z2}As$ layer which are successively arranged in a direction away from the conducting substrate, wherein z1>x, z2>x, and the values of z1 and z2 should allow $Al_{z1}Ga_{1-z1}As$ and $Al_{z2}Ga_{1-z2}As$ not to absorb incident laser. That is, z1 and z2 can be adjusted according to the wavelength of the incident laser, so as to the specific compositions of $Al_{z1}Ga_{1-z1}As$ and $Al_{z2}Ga_{1-z2}As$ to meet the above requirements.

Further, the N-type current spreading layer and the $N^+$-type ohmic contact layer are also successively formed on the Nth subcell, and the current spreading layer does not absorb the incident target laser.

For example, the PN junction subcell can be the AlGaAs subcell, wherein the N-type $Ga_{0.52}In_{0.48}P$ or N-type $Al_{y3}Ga_{1-y3}As$ and the $N^+$-type GaAs ohmic layers are successively formed on the Nth AlGaAs subcell, y3>x, and the value of y3 should allow the current spreading layer not to absorb incident laser. That is, y3 can be adjusted according to the wavelength of the incident laser, so as to change the specific composition of $Al_{y3}Ga_{1-y3}As$ to meet the above requirements.

For example, the PN junction subcell can be the $In_{1-x}Ga_xAs_yP_{1-y}$ subcell, wherein the N-type InP or N-type $(Al_{z3}Ga_{1-z3})_{0.47}In_{0.53}As$ current spreading layer and the $N^+$-type $In_{0.53}Ga_{0.47}As$ ohmic layer are successively formed on the Nth $In_{1-x}Ga_xAs_yP_{1-y}$ subcell, wherein the value of z3 should allow the current spreading layer not to absorb incident laser. In other words, z3 can be adjusted according to the wavelength of the incident laser, so as to change the specific compositions of $(Al_{z3}Ga_{1-z3})_{0.47}In_{0.53}As$ to meet the above requirements.

In some embodiments, the conducting substrate adopts a P-type substrate, the cell unit laminated body includes a first $In_{1-x}Ga_xAs_yP_{1-y}$ subcell, a first tunnel junction, until a (N−1) th $In_{1-x}Ga_xAs_yP_{1-y}$ subcell, a (N−1)th tunnel junction and a Nth $In_{1-x}Ga_xAs_yP_{1-y}$ subcell which are successively formed on the conducting substrate, wherein the tunnel junctions and subcells are alternately arranged, and none of the first tunnel junction to the (N−1)th tunnel junction absorbs incident laser.

Further, each of the first tunnel junction to (N−1)th tunnel junction contains $N^+$-type InP or $N^+$-type $(Al_{z1}Ga_{1-z1})_{0.47}In_{0.53}As$ layer and a $P^+$-type InP or $P^+$-type $(Al_{z2}Ga_{1-z2})_{0.47}In_{0.53}As$ layer which are successively arranged in a direction away from the conducting substrate, wherein the values of z1 and z2 should allow $(Al_{z1}Ga_{1-z1})_{0.47}In_{0.53}As$ and $(Al_{z2}Ga_{1-z2})_{0.47}In_{0.53}As$ not to absorb incident laser. In other words, z1 and z2 can be adjusted according to the wavelength of the incident laser, so as to change the specific compositions of $(Al_{z1}Ga_{1-z1})_{0.47}In_{0.53}As$ and $(Al_{z2}Ga_{1-z2})_{0.47}In_{0.53}As$ so as to meet the above requirement.

In the above embodiment of the present application, substance compositions of the first tunnel junction to the (N−1)th tunnel junction can be completely identical.

In some embodiments, the thicknesses of absorption layers of the PN-junction subcells in the cell unit laminated body should allow the incident laser to be sufficiently absorbed while keeping the light current generated in each subcell the same.

For example, the thicknesses of $Al_xGa_{1-x}As$ PN junction subcells in the cell unit laminated body can allow the incident laser to be sufficiently absorbed while keeping light current generated in each $Al_xGa_{1-x}As$ PN-junction subcells identical. For example again, the thicknesses of $In_{1-x}Ga_xAs_yP_{1-y}$ PN junction subcells in the cell unit laminated body can allow the incident laser to be sufficiently absorbed while keeping light current generated in each $In_{1-x}Ga_xAs_yP_{1-y}$ PN junction subcells identical.

In some embodiments, an antireflection film is also formed on the light receiving surface of the photovoltaic cell.

In some embodiments, the light receiving surface of the photovoltaic cell is on the top top side of the photovoltaic cell.

In the above embodiments of the present application, the thickness of the absorption layer of the thinnest subcell in a multi junction cell can be obviously increased by using a semiconductor material with a band gap close to the photon energy as the absorption layers so that growth of thin subcell in the multi-junction laminated cell is more easy to control, and it is possible to fabricate a multi junction cell with more than 20 junctions. Its principle is that when the band gap of the semiconductor is close to the photon energy of the laser, namely, when the band gap of the semiconductor is large, the absorption coefficient of the semiconductor is sharply decreased, and the thickness required for absorbing a certain ratio of incident light is significantly increased. Meanwhile, in the above embodiment of the present application, a semiconductor material with a slightly smaller band gap is used as a bottom cell absorption layer with a large thickness, so that the structure of the whole photovoltaic cell will not be extremely thick due to adoption of single band gap material with a small absorption coefficient. Thus, adoption of the multi-band gap multi junction laminated cell provided by the present application not only allows the multi-junction laminated cell to be more easily fabricated, and the benefit is especially significant for a high-junction-number multi junction (more than 12 junctions) laminated photovoltaic cell meanwhile not appreciably increasing the fabrication cost.

Another aspect of the embodiment of the present application provides a method for fabricating a multi junction laminated laser photovoltaic cell, including:

growing and forming a cell unit laminated body on a conducting substrate;

forming a dielectric film on the cell unit laminated body, and processing a window on the dielectric film, so that at least local region of the ohmic contact layer of the cell unit laminated body is exposed from the window;

fabricating an upper electrode on the ohmic contact layer exposed from the window;

etching the region of the ohmic contact layer which is exposed from the window and not covered by the upper electrode, until the current spreading layer of the cell unit laminated body is exposed; and fabricating a lower electrode on the back surface of the conducting substrate.

For example, in some specific embodiments, the fabrication method can include: successively growing and forming several $Al_xGa_{1-x}As$, InGaAsP or AlGaInAs PN-junction subcells, tunnel junctions for electrically connection between subcells, current spreading layers and ohmic contact layers with a heavy doping on a conducting single crystal substrate, then successively fabricating an upper electrode with grid electrodes, a lower electrode and antireflection films to form a target device, wherein the materials of absorption layers of cells can be $Al_xGa_{1-x}As$, InGaAsP or AlGaInAs.

In some embodiments, the fabrication method can also include: growing and forming the cell laminated body using MOCVD or MBE.

Further, in the process of growing the cell unit laminated body, N-type dopant can be Si, Se, S or Te, but are not limited thereto.

Further, in the process of growing and forming the cell unit laminated body, the P-type dopant include Be, Zn, Mg or C, but are not limited thereto.

In some embodiments, the fabrication method can also include: thinning the conducting substrate from the back surface, and then fabricating the lower electrode on the back surface of the conducting substrate.

In some embodiments, the fabrication method can also include: forming ohmic contact between the upper electrode and the ohmic contact layer at least through rapid thermal annealing.

In some embodiments, the fabrication method can also include: fabricating an antireflection film on the light receiving surface of the formed multi junction laminated laser photovoltaic cell.

In some specific embodiments of the present application, the fabrication method can include the following steps:

(1) successively growing respective material layers on the conducting single crystal substrate using an MOCVD method, wherein the N-type doping atom is Si, Se, S or Te; and the P-type doping atom is Zn, Mg or C;

or, successively growing respective material layers on the conducting single crystal substrate using an MBE method, wherein the N-type doping atom is Si, Se, S or Te; and the P-type doping atom is Zn, Mg or C;

(2) depositing a layer of dielectric film on the front surface ($N^+$ GaAs or $N^+$ $In_{0.53}Ga_{0.47}As$ contact layer) of the above multi-junction laminated cell wafer (cell unit laminated body) grown, then fabricating a round window on the dielectric film using photolithography methods to expose $N^+$ GaAs or $N^+$ $In_{0.53}Ga_{0.47}As$ contact layer;

fabricating the upper electrode containing the grid electrode in the round light receiving region by spin coating of photoresist, photolithography and electron beam evaporating (thermal evaporation or magnetron sputtering) a layer or multiple layers of metal and metal stripping process steps;

(4) etching the $N^+$-type GaAs or $N^+$-type $In_{0.53}Ga_{0.47}As$ contact layer of the portion of the round light receiving region not covered by the grid electrode using a wet method, until the current spreading layer is exposed;

(5) thinning the substrate by mechanical polishing;

(6) fabricating a plane electrode by electron beam evaporating, thermal evaporating or magnetron sputtering a layer or multiple layers of metal;

(7) forming ohmic contact between metal and a semiconductor using rapid thermal annealing;

(8) fabricating an antireflection film on the light receiving surface;

(9) removing the antireflection film at bonging pads beyond the round light receiving surface to expose the metal for wire bonding; and

(10) cleaving or cutting the laser photovoltaic wafer into cell chip to complete the laser photovoltaic cell process.

Some more specific embodiments of the present application relate to an AlGaAs 12-junction laminated laser photovoltaic cell fabricated on an N-type GaAs substrate. The method for fabricating the laser photovoltaic cell includes the following specific steps:

(I) growth of 12-junction AlGaAs laminated laser photovoltaic cell epitaxial wafer (1) growing a first tunnel junction on an N-type AlGaAs substrate, the tunnel junction including $N^+$-type $Ga_{0.52}In_{0.48}P$ or $N^+$-type (Al)GaAs layer and a $P^+$-type (Al)GaAs layer which are successively arranged in a direction away from the substrate;

(2) growing a P-type $Al_{y1}Ga_{1-y1}As$ (y1>x) or P-type $Ga_{0.52}In_{0.48}P$ back surface field layer, a P-type $Al_xGa_{1-x}As$ base region, an N-type $Al_xGa_{1-x}As$ emitter region, an N-type $Al_{y2}Ga_{1-y2}As$(y2>x) or an N-type $Ga_{0.52}In_{0.48}P$ (matched with GaAs lattice) window layer on the above first tunnel junction to form a first AlGaAs subcell;

(3) growing a second tunnel junction on the above first AlGaAs subcell, the tunnel junction including a $N^+$-type $Ga_{0.52}In_{0.48}P$ or $N^+$-type $Al_{z1}Ga_{1-z1}As$ (z1>x1) layer and a $P^+$-type $Al_{z1}Ga_{1-z1}As$ (z1>x1) layer which are successively arranged in a direction away from the substrate, wherein setting of z1 and z2 allows $Al_{z1}Ga_{1-z1}As$ and $Al_{z2}Ga_{1-z2}$. As not to absorb incident light;

(4) then successively and alternately growing the tunnel junction (identical to the structure of the first tunnel junction) and a AlGaAs subcell, until twelfth AlGaAs subcell; and (5) growing an $N^+$-type (greater than $4 \times 10^{18}$ $cm^{-3}$) AlGaAs serving as ohmic contact on the N-type $Al_{y3}Ga_{1-y3}$ As (y3>x) or the N-type $Ga_{0.52}In_{0.48}P$ window layer of the twelfth AlGaAs subcell, wherein the setting of y3 allows the current spreading layer not to absorb incident light.

Various structure layers in the twelfth-junction GaAs laser photovoltaic cell epitaxial wafer are all grown using the MOCVD or MBE method;

If the MOCVD method is used, the N-type doping atom can be Si, Se, S or Te, and the P-type doping atom can be Zn, Mg or C, but is not limited thereto;

If the MBE method is used, the N-type doping atom can be Si, Se, S or Te, and the P-type doping atom can be Zn, Mg or C, but is not limited thereto.

(II) Fabrication of a device (multi junction laminated laser photovoltaic cell)

(1) depositing a layer of $SiO_2$ dielectric film on the front surface ($N^+$ GaAs contact layer) of the above AlGaAs 12-junction laminated cell epitaxial wafer subjected to epitaxial growth using PECVD, and then fabricating a round window using photolithography methods to expose the $N^+$ GaAs contact layer;

(2) fabricating an upper electrode containing a grid electrode in a round light receiving region through process steps such as spin coating of photoresist, photolithography, electron beam evaporating (thermal evaporation or magnetron sputtering) AuGe/Ni/Au and metal stripping process steps;

(3) etching the $N^+$-type GaAs contact layer whose grid electrode is not covered in the round light receiving region using a wet method, until the current spreading layer is exposed;

(4) thinning the substrate to about 100 μm by mechanical polishing;

(5) fabricating a plane electrode by electron beam evaporation, thermal evaporation or magnetron sputtering of a layer or multiple layers of metals (using AuGe/Ni/Au for the N-type GaAs substrate, and Ti/Pd/Au for the P-type substrate);

(6) forming ohmic contact between metal and a semiconductor using rapid thermal annealing;

(7) fabricating an antireflection film on the light receiving surface;

(8) removing the antireflection film at the lead bounding position beyond the light receiving surface through the photolithography method to expose the metal for bounding leads; and (9) cleaving or cutting wafers to separate the laser photovoltaic cell chip so as to complete the laser photovoltaic cell process.

Some more specific embodiments of the present application relate to an InGaAsP or AlGaInAs 12-junction laminated laser photovoltaic cell fabricated on the N-type InP substrate. A method for fabricating the laser photovoltaic cell includes the following specific steps:

(I) Growth of 12-junction InGaAsP laminated laser photovoltaic cell epitaxial wafer (cell unit laminated body)

(1) growing a first tunnel junction on an N-type InP substrate, the tunnel junction including an $N^+$-type InP or $N^+$-type $(Al_{z1}Ga_{1-z1})_{0.47}In_{0.53}As$ layer and a $P^+$-type InP or $(Al_{z2}Ga_{1-z2})_{0.47}In_{0.53}As$ layer which are successively arranged in a direction away from the substrate, wherein the values of z1 and z2 should allow $(Al_{z1}Ga_{1-z1})_{0.47}In_{0.53}As$ or $(Al_{z2}Ga_{1-z2})_{0.47}In_{0.53}As$ not to absorb incident laser. In other words, z1 and z2 can be adjusted according to the wavelength of the incident laser, so as to change the specific compositions of $(Al_{z1}Ga_{1-z1})_{0.47}In_{0.53}As$ and $(Al_{z2}Ga_{1-z2})_{0.47}In_{0.53}As$ to meet the above requirements;

(2) growing a P-type $(Al_{p1}Ga_{1-p1})_{0.47}In_{0.53}As$ or P-type InP back surface field layer, a P-type $In_{1-x}Ga_xAs_yP_{1-y}$ base region, an N-type $In_{1-x}Ga_xAs_yP_{1-y}$ emitter region, an N-type $(Al_{p2}Ga_{1-p2})_{0.47}In_{0.53}As$ or N-type InP window layer on the above first tunnel junction to form a first InGaAsP subcell, wherein the values of p1 and p2 should allow $(Al_{p1}Ga_{1-p1})_{0.47}In_{0.53}As$ and $(Al_{p2}Ga_{1-p2})_{0.47}In_{0.53}As$ not to absorb laser. In other words, p1 and p2 can be adjusted according to the wavelength of incident laser, so as to change the specific compositions of $(Al_{p1}Ga_{1-p1})_{0.47}In_{0.53}As$ and $(Al_{p2}Ga_{1-p2})_{0.47}In_{0.53}As$ to meet the above requirements;

(3) growing a second tunnel junction on the above first InGaAsP subcell, the tunnel junction including an $N^+$-type InP or $N^+$-type $(Al_{z1}Ga_{1-z1})_{0.47}In_{0.53}As$ layer and a $P^+$-type InP or $(Al_{z2}Ga_{1-z2})_{0.47}In_{0.53}As$ layer, wherein the values of z1 and z2 should allow $(Al_{z1}Ga_{1-z1})_{0.47}In_{0.53}As$ and $(Al_{z2}Ga_{1-z2})_{0.47}In_{0.53}As$ not to absorb laser. In other words, z1 and z2 can be adjusted according to the wavelength of the incident laser, so as to change the specific compositions of $(Al_{z1}Ga_{1-z1})_{0.47}In_{0.53}As$ and $(Al_{z2}Ga_{1-z2})_{0.47}In_{0.53}As$ to meet the above requirements;

(4) then successively and alternately growing tunnel junctions (identical to the structure of the first tunnel junction) and a InGaAsP subcell, until the twelfth InGaAsP subcell;

(5) growing N-type InP or N-type $(Al_{z3}Ga_{1-z3})_{0.47}In_{0.53}A$ current spreading layers and an $N^+$-type $In_{0.53}Ga_{0.47}Asp$ ohmic contact layer on the N-type InP or N-type$(Al_{p2}Ga_{1-p2})_{0.47}In_{0.53}As$ window layer of the twelfth InGaAsP subcell, wherein the value of z3 should allow current spreading layer not to absorb incident laser. In other words, z3 can be adjusted according to the wavelength of the incident laser, so as to change the specific compositions of $(Al_{z3}Ga_{1-z3})_{0.47}In_{0.53}As$ to meet the above requirements.

the respective layers in the 12-junction InGaAsP laser photovoltaic cell epitaxial wafer are grown by using an MOCVD or MBE method;

If the MOCVD method is used, the N-type doping atom is Si, Se, S or Te, and the P-type doping atom is Zn, Mg or C;

If the MBE method is used, the N-type doping atom is Si, Se, S or Te, and the P-type doping atom is Zn, Mg or C.

(II) Fabrication of a device (multi junction laminated laser photovoltaic cell)

(1) depositing a layer of $SiO_2$ dielectric film on the front surface ($N^+$ $In_{0.53}Ga_{0.47}As$ contact layer) of the above InGaAsP 12-junction laminated cell epitaxial wafer subjected to epitaxial growth using PECVD, then fabricating a round window using photolithography methods to expose the $N^+In_{0.53}Ga_{0.47}As$ contact layer;

(2) fabricating an upper electrode containing a grid electrode in a round light receiving region through process steps such as spin coating of photoresist, photolithography, electron beam evaporation (thermal evaporation or magnetron sputtering) AuGe/Ni/Au and metal stripping;

(3) etching the $N^+$-type $In_{0.53}Ga_{0.47}As$ contact layer which is not covered by the grid electrode in the round light receiving region until the current spreading layer is exposed;

(4) thinning the substrate to about 100 μm by mechanical polishing;

(5) fabricating a plane electrode by electron beam evaporation, thermal evaporation or magnetron sputtering of a layer or multiple layers of metals (using AuGe/Ni/A for N-type InP substrates, Ti/Pd/Au for P-type substrates);

(6) forming ohmic contact between metal and a semiconductor using rapid thermal annealing;

(7) fabricating an antireflection film on the light receiving surface;

(8) removing the antireflection film at the bonding pads beyond the light receiving surface through the photolithography method to expose the metal for wore bonding; and (9) cleaving or cutting wafers to separate the laser photovoltaic cell chip so as to complete the laser photovoltaic cell process.

The multi-junction laminated laser photovoltaic cell of the above embodiment of the present application uses $Al_{x1}Ga_{1-x1}As$ or InGaAsP as an absorption layer to convert laser energy, multiple band gap materials are used as absorption layers, such the band gap design can significantly increase the thickness of the absorption layer of the thinnest subcell in the multi junction cell so that the thinnest subcell in the multi junction cell is more easy to grow and control, and meanwhile the structure of the whole cell will not be extremely thick due to adoption of a single band gap material having a small absorption coefficient, without significant increase of fabrication cost, especially the effect of the super-multi-junction (more than 12 junctions) laminated photovoltaic cell.

The technical solutions of the present application will be described in detail in combination with drawings and examples.

Figure 2:
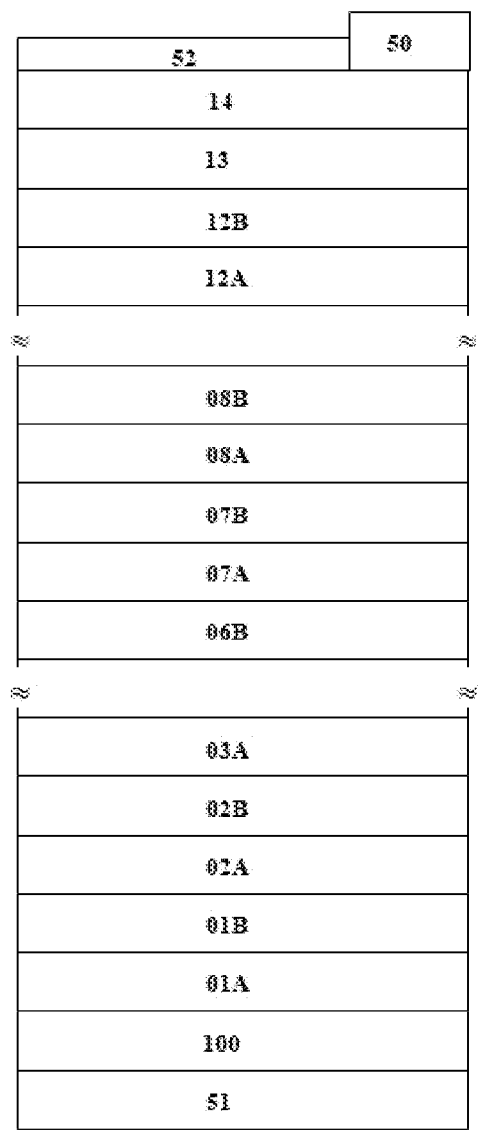
FIG. 2 shows a cross-sectional diagram of an initial finished product of a multi junction laminated laser photovoltaic cell in an embodiment of the present application.
Figure 3:
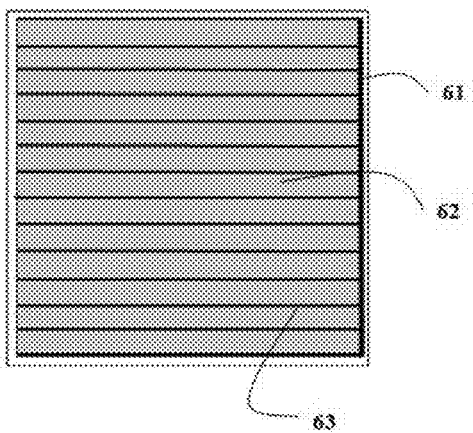
FIG. 3 shows a top view of a multi-junction laminated laser photovoltaic cell finished product in an embodiment of the present application.

Referring to FIG. 1, FIG. 2 and FIG. 3, a typical embodiment of the present application relates to a 12-junction AlGaAs laminated laser photovoltaic cell converting 808 nm laser, comprising a GaAs substrate 100, a first tunnel junction 01A, a first GaAs subcell 01B, a second tunnel junction 02A, a second GaAs subcell 02B, a third tunnel junction 03A, until a sixth GaAs subcell 06B; a seventh tunnel junction 07A, a seventh AlGaAs subcell 07B, an eighth tunnel junction 08A, an eighth AlGaAs subcell 08B, until a twelfth tunnel junction 12A, a twelfth AlGaAs subcell 12B, a current spreading layer 13, a GaAs ohmic contact layer 14, a negative electrode 50, a positive electrode 51, an antireflection film 52, a bus 61, a light receiving surface 62 and an electrode grid line 63, wherein the first GaAs subcell to the twelfth AlGaAs subcell 01B, 02B . . . 11B and 12B contain a AlGaAs or GaInP back surface field layer xxB0, a AlGaAs base region xxB1, a AlGaAs emitter region xxB2, a AlGaAs or GaInP window layer xxB3; the first tunnel junction 01A includes (Al)GaAs or GaInP 01A0 and (Al)GaAs layer 01A1; the second tunnel junction to the sixth tunnel junction 02A, 03A . . . 11A and 12A include (Al)GaAs or GaInP xxA0 and AlGaAs layer xxA1.

The method for fabricating the AlGaAs laminated laser photovoltaic cell specifically includes the following steps:

1. growing a AlGaAs 12-junction laminated laser photovoltaic cell epitaxial wafer converting 808 nm laser using an MOCVD method, wherein 12 subcells are divided into two groups, the absorption layer of 6 subcells at the bottom uses GaAs with a band gap of 1.428 eV, the absorption layer of 6 subcells on the top uses $Al_{0.07}Ga_{0.93}As$ with a band gap of 1.515 eV. The cell structure and numbers of the respective layers are shown in FIG. 1.

(1) growing the first tunnel junction 01A, which consists of a 20-nm $N^+$-type GaAs layer 01A0 with a Si doping concentration of $1\times10^{19}$ $cm^{-3}$ and a 20-nm $P^+$-type $Al_{0.3}Ga_{0.7}As$ layer 01A1 with a C doping concentration of $4\times10^{19}$ $cm^{-3}$, on the N-type GaAs substrate ($1-2\times10^{18}$ $cm^{-3}$, thickness is 350 μm) 100;

(2) growing 30-nm P-type $Al_{0.2}Ga_{0.8}As$ 01B0 with a C doping concentration of $1\times10^{18}$ $cm^{-3}$ as a first GaAs subcell 01B, and then growing 1356-nm GaAs 01B1 with a C doping concentration of $4\times10^{17}$ $cm^{-3}$ as the base region of the first subcell 01B, growing 200-nm GaAs 01B2 with a Si doping concentration of $1\times10^{18}$ $cm^{-3}$ as the emitter region of the first subcell 01B, and subsequently growing 40-nm $Al_{0.2}Ga_{0.8}As$ 01B3 with a Si doping concentration of $1\times10^{18}$ $cm^{-3}$ as the window layer of the first subcell 01B;

(3) growing 20-nm $Al_{0.2}Ga_{0.8}As$ 02A0 with a Si doping concentration of $1\times10^{19}$ $cm^{-3}$ as the $N^+$ layer of the second tunnel junction 02A and 20-nm $Al_{0.3}Ga_{0.7}As$ layer 02A1 with a C doping concentration of $4\times10^{19}$ $cm^{-3}$ as the $P^+$ layer of the second tunnel junction 02A;

(4) successively and alternately growing other GaAs subcells (02B, 03B, 04B and 05B) and tunnel junctions (03A, 04A, 05A and 06A), until the sixth GaAs subcell 06B according to the above method;

(5) growing 20-nm $Al_{0.2}Ga_{0.8}As$ 07A0 with a Si doping concentration of $1\times10^{19}$ $cm^{-3}$ as the $N^+$ layer of the seventh tunnel junction 07A and 20-nm $Al_{0.3}Ga_{0.7}As$ layer 07A1 with a C doping concentration of $4\times10^{19}$ $cm^{-3}$ as the $P^+$ layer of the seventh tunnel junction 07A1;

(6) growing 30-nm P-type $Al_{0.2}Ga_{0.8}As$ 07B0 with a C doping concentration of $1\times10^{18}$ $cm^{-3}$ as the back surface field of the seventh $Al_{0.07}Ga_{0.93}As$ subcell 07B, then growing $Al_{0.07}Ga_{0.93}As$ 07B1 with a thickness of about 166.2 nm and a C doping concentration of $4\times10^{17}$ $cm^{-3}$ as the base region of the seventh subcell 07B, subsequently growing 50-nm $Al_{0.07}Ga_{0.93}As$ 07B2 with a Si doping concentration of $1\times10^{18}$ $cm^{-3}$ as the emitter region of the seventh subcell 07B, and then growing 40-nm $Al_{0.2}Ga_{0.8}As$ 07B3 with a Si doping concentration of $1\times10^{18}$ $cm^{-3}$ as the window layer of the first subcell 07B;

(7) growing $Al_{0.07}Ga_{0.93}As$ subcells (08B, 09B, 10B and 11B) and tunnel junctions (09A, 10A, 11A and 12A), until the twelfth $Al_{0.07}Ga_{0.93}As$ subcell 12B. In order to ensure that the device absorbs 99% of light entering the cell and satisfies that light current generated in each (Al) GaAs subcells is the same. The thicknesses of various subcell absorption layers are as shown in Table 1. As a comparison, the thicknesses of respective subcells of a 12-junction cell using a GaAs or $Al_{0.07}Ga_{0.93}As$ single band gap material as an absorption layer are simultaneously listed in Table 1.

TABLE 1

The thicknesses of a 12-junction laser photovoltaic cell using dual-band gap AlGaAs absorption layers as well as GaAs or Al0.07Ga0.93As single band gap absorption lasers to convert 808 nm laser.

| Number of subcells | Dual band gap $Al_{0.07}Ga_{0.93}As$/ GaAs cell | GaAs cell | $Al_{0.07}Ga_{0.93}As$ cell |
|---|---|---|---|
| 12 | 0.1230 | 0.0602 | 0.1230 |
| 11 | 0.1346 | 0.0659 | 0.1346 |
| 10 | 0.1486 | 0.0727 | 0.1486 |
| 9 | 0.1659 | 0.0812 | 0.1659 |
| 8 | 0.1877 | 0.0919 | 0.1877 |
| 7 | 0.2162 | 0.1058 | 0.2162 |
| 6 | 0.1247 | 0.1247 | 0.2548 |
| 5 | 0.1519 | 0.1519 | 0.3103 |
| 4 | 0.1944 | 0.1944 | 0.3970 |
| 3 | 0.2701 | 0.2701 | 0.5518 |
| 2 | 0.4459 | 0.4459 | 0.9108 |
| 1 | 1.5557 | 1.5557 | 3.1780 |
| GaAs substrate | 350 | | |
| Total thickness of absorption layer | 3.719 | 3.22 | 6.578 |

(8) growing a 1000-nm $Ga_{0.52}In_{0.48}P$ current spreading layer with a Si doping concentration of $1\times10^{18}$ $cm^{-3}$ and a 1000-nm GaAs ohmic contact layer 14 with a Si doping concentration of $6\times10^{18}$ $cm^{-3}$ on the window layer 12B3 of the twelfth AlGaAs subcell, so as to complete the growth of epitaxial wafer whose structure is as shown in FIG. 1.

II. A process for fabricating a 12-junction AlGaAs laminated laser photovoltaic cell (1) depositing a layer of 200 nm $SiO_2$ on the front surface ($N^+$ GaAs contact layer 15) of a AlGaAs laminated cell epitaxial wafer using PECVD, then performing spin coating of photoresist on this layer $SiO_2$, and transferring the patterns of a photolithography mask to the photoresist using photoresist exposure and developing to expose the $SiO_2$ surface; and subsequently, etching a light receiving surface window on the $SiO_2$ with photoresist as the mask using HF buffer etching solution;

(2) subsequently, spin coating photoresist on the front surface of the wafer, transferring a grid line pattern of a photolithography mask to the previously fabricated light receiving surface through photoresist exposure and developing to expose partial $N^+$ GaAs surface so as to fabricate the grid line electrode;

(3) successively depositing AuGe/Ni/Au (35/10/100 nm), and 1000-nm Ag and 100-nm Au metal layers on the front surface of the wafer through an electron beam evaporation method as a negative (upper) electrode 50, removing metal in the undesired region using a lift-off method to fabricate an upper electrode with a width of 6 μm and an interval of 250 μm in the light receiving surface;

(4) etching an $N^+$-type GaAs contact layer of a grid electrode in the light receiving region which is not covered using a wet method, until an electric $Ga_{0.52}In_{0.48}P$ current spreading layer 13 is exposed;

(5) thinning the GaAs substrate to about 110 μm by mechanical polishing;

(6) successively depositing AuGe/Ni/Au (35/10/100 nm) on the GaAs substrate 100 on the back surface of the wafer using electron beam evaporation to form a lower electrode layer 51, wherein at this moment, the structure of the initial finished product of the AlGaAs 12-junction laminated laser photovoltaic cell device is as shown in FIG. 2;

(7) annealing for 90 s in a N2 ambient at 420° C. using rapid thermal annealing to form ohmic contact between N type and GaAs;

(8) evaporating 43 nm $TiO_2$/102 nm $SiO_2$ dual-layer antireflection film 52 on the light receiving surface using an optical coating machine;

(9) removing the antireflection film at the bus beyond the light receiving surface through a photolithography method to expose metal for bounding leads; and

(10) completing the laser photovoltaic cell process by cleaving and separating the laser photovoltaic cell chips. The structure of the finished AlGaAs 12-junction laminated laser photovoltaic cell device is shown in FIG. 3, and the open-circuit voltage of this cell is greater than 12V.

Figure 4:
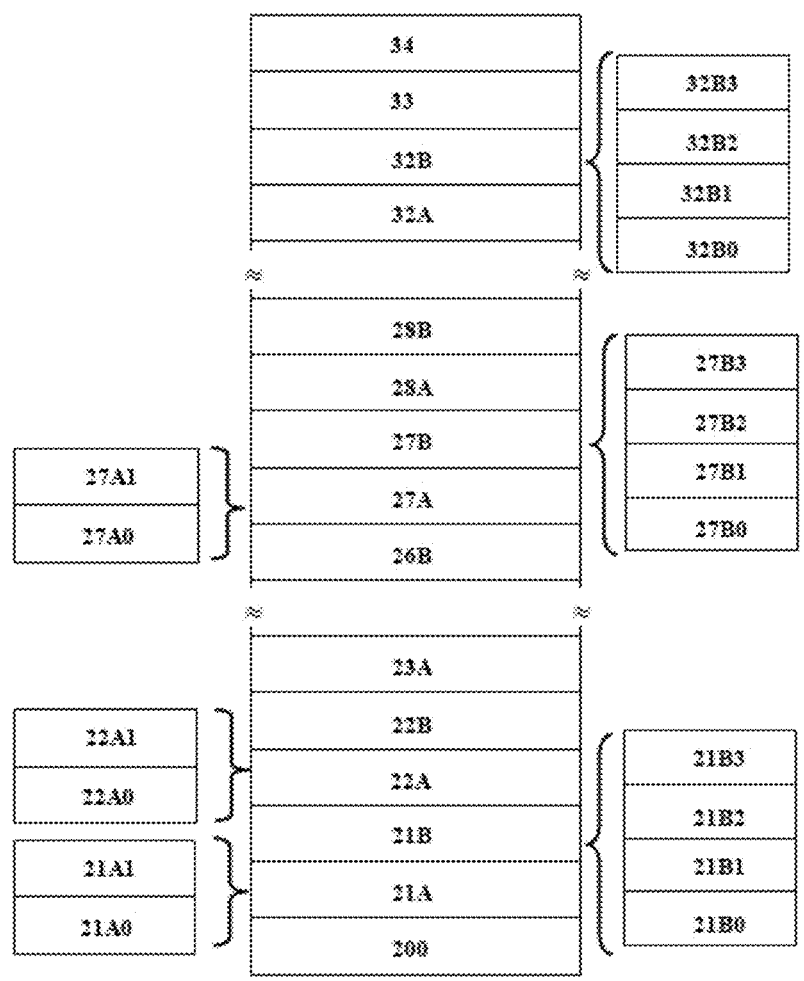
FIG. 4 shows a cross-sectional diagram of an epitaxial wafer of a multi-junction laminated laser photovoltaic cell in another embodiment of the present application.
Figure 5:
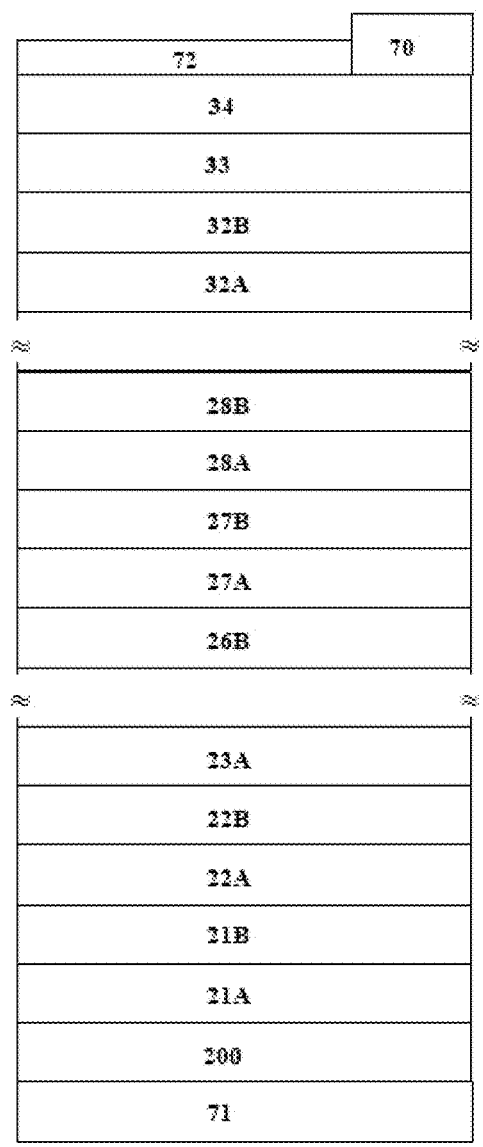
FIG. 5 shows a cross-sectional diagram of an initial finished product of a multi junction laminated laser photovoltaic cell in another embodiment of the present application.
Figure 6:
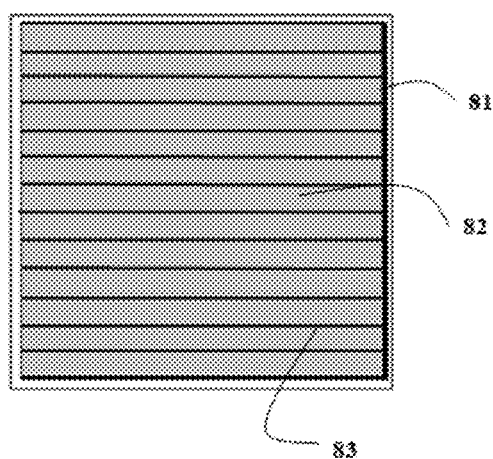
FIG. 6 shows a top view of a multi-junction laminated laser photovoltaic cell finished product in another embodiment of the present application.

Referring to FIG. 4, FIG. 5 and FIG. 6, another typical embodiment of the present application relates to a 12-junction InGaAsP laminated laser photovoltaic cell converting 1064 nm laser, including an InP substrate 200, a first tunnel junction 21A, a first InGaAsP subcell 21B, a second tunnel junction 22A, a second InGaAsP subcell 22B, a third tunnel junction 23A, until a sixth InGaAsP subcell 26B; a seventh tunnel junction 27A, a second InGaAsP subcell 27B, an eighth tunnel junction 28A, an eighth InGaAsP subcell 28B, until a twelfth tunnel junction 32A, a twelfth InGaAsP subcell 32B, a current spreading layer 33, a $In_{0.53}Ga_{0.47}As$ ohmic contact layer 34, a negative electrode 70, an antireflection film 72, a bus 81, a light receiving surface 82 and an electrode grid line 83, wherein the first $In_{0.53}Ga_{0.47}As$ subcell to the twelfth $In_{0.53}Ga_{0.47}As$ subcell 21B, 22B . . . 31B and 32B contain a $(Al_{p1}Ga_{1-p1})_{0.47}In_{0.53}As$ or InP back surface field layer xxB0, an $In_{0.53}Ga_{0.47}As$ base region xxB1, an $In_{0.53}Ga_{0.47}As$ emitter region xxB2, an $In_{0.53}Ga_{0.47}As$ or InP window layer xxB3; the first tunnel junction 21A includes $(Al_{z1}Ga_{1-z1})_{0.47}In_{0.53}As$ or InP 21A0 and $(Al_{z1}Ga_{1-z1})_{0.47}In_{0.53}As$ or InP layer 21A1; the second tunnel junction to the sixth tunnel junction 22A, 23A . . . 31A and 32A include $(Al_{z1}Ga_{1-z1})_{0.47}In_{0.53}As$ or InP layer xxA0 and $(Al_{z1}Ga_{1-z1})_{0.47}In_{0.53}As$ or InP layer xxA1.

The method for fabricating the 1064 nm InGaAsP laminated laser photovoltaic cell specifically includes the following steps:

1. growing a 12-junction laminated laser photovoltaic cell epitaxial wafer with InGaAsP 1064 nm laser using an MOCVD method, wherein 12 subcells are divided into two groups, the absorption layer of 6 subcells at the bottom uses $In_{0.845}Ga_{0.155}As_{0.337}P_{0.663}$ with a band gap of 1.1 eV, the absorption layer of 6 subcells on the top uses $In_{0.89}Ga_{0.11}As_{0.24}P_{0.76}$ with a band gap of 1.17 eV. The cell structure and numbers of respective layers are shown in FIG. 4.

(1) growing the first tunnel junction 21A, which consists of a 20-nm N+-type $Al_{0.47}In_{0.53}As$ layer 21A0 with a Si doping concentration of $1 \times 10^{19}$ cm$^{-3}$ and a 20-nm P+-type $Al_{0.47}In_{0.53}As$ layer 21A1 with a C or Zn doping concentration of more than $1 \times 10^{19}$ cm$^{-3}$, on the N-type InP substrate (1-3$\times 10^{18}$ cm$^{-3}$, thickness is 350 μm) 100;

(2) growing 30-nm P-type InP 21B0 with a Zn doping concentration of $1 \times 10^{18}$ cm$^{-3}$ as a back surface field of a first $In_{0.845}Ga_{0.155}As_{0.337}P_{0.663}$ subcell 21B, and then growing 1389-nm $In_{0.845}Ga_{0.155}As_{0.337}P_{0.663}$ 21B1 with a Zn doping concentration of $4 \times 10^{17}$ cm$^{-3}$ as a base region of the first subcell 21B, then growing 200-nm $In_{0.845}Ga_{0.155}As_{0.337}P_{0.663}$ 21B2 with a Si doping concentration of about $1 \times 10^{18}$ cm$^{-3}$ as the emitter region of the first subcell 21B, and subsequently growing 40-nm InP 21B3 with a Si doping concentration of $1 \times 10^{18}$ cm$^{-3}$ as a window layer of the first subcell 21B;

(3) growing 20-nm $Al_{0.47}In_{0.53}As$ 22A0 with a Si doping concentration of $1 \times 10^{19}$ cm$^{-3}$ as the N+ layer of the second tunnel junction 22A and 20-nm $Al_{0.47}In_{0.53}As$ layer 22A1 with a C doping concentration of $1 \times 10^{19}$ cm$^{-3}$ as the P+ layer of the second tunnel junction 22A;

(4) successively and alternately growing other $In_{0.845}Ga_{0.155}As_{0.337}P_{0.663}$ subcells (22B, 23B, 24B and 25B) and tunnel junctions (23A, 24A, 25A and 26A), until the sixth $In_{0.845}Ga_{0.155}As_{0.337}P_{0.663}$ subcell 26B according to the above method;

(5) growing 20-nm $Al_{0.47}In_{0.53}As$ 27A0 with a Si doping concentration of $1 \times 10^{19}$ cm$^{-3}$ as the N+ layer of the seventh tunnel junction 27A and 20-nm $Al_{0.47}In_{0.53}As$ layer 27A1 with a Zn doping concentration of $4 \times 10^{19}$ cm$^{-3}$ as the P+ layer of the seventh tunnel junction 27A;

(6) growing 30-nm P-type InP 27B0 with a Zn doping concentration of $1 \times 10^{18}$ cm$^{-3}$ as the back surface field of the seventh $In_{0.89}Ga_{0.11}As_{0.24}P_{0.76}$ subcell 27B, then growing 146.2-nm $In_{0.89}Ga_{0.11}As_{0.24}P_{0.76}$ 27B1 with a Zn doping concentration of $4 \times 10^7$ cm$^{-3}$ as the base region of the seventh subcell 27B, then growing 70-nm $In_{0.89}Ga_{0.11}As_{0.24}P_{0.76}$ 07B2 with a Si doping concentration of $1 \times 10^{18}$ cm$^{-3}$ as the emitter region of the seventh subcell 27B, subsequently growing 40-nm InP 27B3 with a Si doping concentration of $1 \times 10^{18}$ cm$^{-3}$ as the window layer of the first subcell 27B;

(7) growing $In_{0.89}Ga_{0.11}As_{0.24}P_{0.76}$ subcells (28B, 29B, 30B and 31B) and tunnel junctions (29A, 30A, 31A and 32A), until the twelfth $In_{0.89}Ga_{0.11}As_{0.24}P_{0.76}$ subcell 32B. In order to ensure that the device absorbs 99% of light entering the cell and satisfies that light current generated in each (Al) GaAs subcells is the same. The thicknesses of various subcell absorption layers are as shown in Table 2. As a comparison, the thicknesses of respective subcells of a 12-junction cell using $In_{0.845}Ga_{0.155}As_{0.337}P_{0.663}$ or $In_{0.89}Ga_{0.11}As_{0.24}P_{0.76}$ single band gap material as an absorption layer are simultaneously listed in Table 2.

TABLE 2

Thicknesses (μm) of respective subcell absorption layers in a 1064 nm 12-junction laser photovoltaic cell with dual-band gap InGaAsP and two InGaAsP single band gap materials as absorption layers

| Number of cells | Dual-band gap 1.17/1.07eV InGaAsP cell | 1,1.1eV $In_{0.845}Ga_{0.15}5As_{0.337}P_{0.663}$ cell | 1.17 eV $In_{0.89}Ga_{0.11}As_{0.24}P_{0.76}$ cell |
|---|---|---|---|
| 12 | 0.1230 | 0.0615 | 0.1230 |
| 11 | 0.1346 | 0.0673 | 0.1346 |
| 10 | 0.1486 | 0.0743 | 0.1486 |

TABLE 2-continued

Thicknesses (μm) of respective subcell absorption layers in a 1064 nm 12-junction laser photovoltaic cell with dual-band gap InGaAsP and two InGaAsP single band gap materials as absorption layers

| Number of cells | Dual-band gap 1.17/1.07eV InGaAsP cell | 1.1eV $In_{0.845}Ga_{0.15}5As_{0.337}P_{0.663}$ cell | 1.17 eV $In_{0.89}Ga_{0.11}As_{0.24}P_{0.76}$ cell |
|---|---|---|---|
| 9 | 0.1659 | 0.0829 | 0.1659 |
| 8 | 0.1877 | 0.0939 | 0.1877 |
| 7 | 0.2162 | 0.1081 | 0.2162 |
| 6 | 0.1274 | 0.1274 | 0.2548 |
| 5 | 0.1552 | 0.1552 | 0.3103 |
| 4 | 0.1985 | 0.1985 | 0.3970 |
| 3 | 0.2759 | 0.2759 | 0.5518 |
| 2 | 0.4554 | 0.4554 | 0.9108 |
| 1 | 1.5890 | 1.5890 | 3.1780 |
| InP substrate | 350 | | |
| Total thickness of absorption layer | 3.777 | 3.289 | 6.578 |

(8) growing a 1000-nm InP current spreading layer 33 with a Si doping concentration of $1\times10^{18}$ cm$^{-3}$ and a 100-nm $In_{0.53}Ga_{0.47}As$ ohmic contact layer 34 with a Si doping concentration of $6\times10^{18}$ cm$^{-3}$ on the window layer 32B3 of the twelfth $In_{0.89}Ga_{0.11}As_{0.24}P_{0.76}$ subcell so as to complete the growth of epitaxial wafer whose structure is as shown in FIG. 4.

II. A process for fabricating a dual-band gap 12-junction InGaAsP laminated laser photovoltaic cell (1) depositing a layer of 200 nm $SiO_2$ on the front surface (N$^+$ $In_{0.53}Ga_{0.47}As$ contact layer 15) of an InGaAsP laminated cell epitaxial wafer subjected to epitaxial growth using PECVD, then spin coating photoresist on this layer $SiO_2$, and transferring the patterns of a photolithography mask to the photoresist using photoresist exposure and developing to expose the $SiO_2$ surface; and subsequently, etching a light receiving surface window on the $SiO_2$ with photoresist as the mask using HF buffer etching solution to expose the N$^+$ $In_{0.53}Ga_{0.47}As$ contact layer;

(2) subsequently, performing spin coating photoresist on the front surface of the wafer, transferring a grid line pattern of a photolithography mask onto the previously fabricated light receiving surface using photoresist exposure and developing to expose partial N$^+$ $In_{0.53}Ga_{0.47}As$ surface so as to fabricate the grid line electrode;

(3) successively depositing AuGe/Ni/Au (35/10/100 nm), and Ag 1000 nm and Au 100 nm metal layers as a negative (upper) electrode 70 on the front surface of the wafer through an electron beam evaporation method, removing metal in the undesired region using a stripping method to fabricate an upper electrode of a grid line with a width of 6 μm and an interval of 250 μm on the light receiving surface;

(4) etching an N$^+$-type $In_{0.53}Ga_{0.47}As$ contact layer of a grid electrode in the light receiving region which is not covered using a wet method, until an electric InP current spreading layer 33 is exposed;

(5) thinning the InP substrate 100 to about 110 μm by mechanical polishing;

(6) successively depositing AuGe/Ni/Au (35/10/100 nm) on the back surface of the InP substrate 200 using electron beam evaporation to form a lower electrode layer 71, wherein at this moment, the structure of the finished InGaAsP 12-junction laminated laser photovoltaic cell device is as shown in FIG. 2;

(7) annealing for 90 s in $N_2$ ambient at 420° C. using rapid thermal annealing to form ohmic contact between metal and N-type $In_{0.53}Ga_{0.47}As$ and between metal and N-type InP;

(8) evaporating a 73 nm $TiO_2$/107 nm $SiO_2$ dual-layer antireflection film 72 on the light receiving surface using an optical coating machine;

(9) removing the antireflection film at the bus beyond the light receiving surface through a photolithography method to expose metal for wire bonding; and

(10) completing the laser photovoltaic cell process by cleaving and separating the laser photovoltaic cell chips. The structure of the finished InGaAsP 12-junction laminated laser photovoltaic cell device is shown in FIG. 6, and the open-circuit voltage of this cell is greater than 7V.

It should be understood that the above descriptions are preferred application examples of the present application, but do not limit the protection scope of the present application. All the technical solutions formed by equal replacements or equivalent replacements are included within the protection scope of the claims of the present application.

What is claimed is:

1. A multi-junction laminated laser photovoltaic cell for converting laser energy into electric energy, comprising:
    a substrate, a cell unit laminated body, an upper electrode and a lower electrode, wherein
    the lower electrode and the upper electrode are electrically connected with a bottom and a top of the cell unit laminated body, respectively;
    the cell unit laminated body comprises an ohmic contact layer, a current spreading layer, laminated N PN-junction subcells, and a first tunnel junction, wherein the first tunnel junction is arranged between laminated two adjacent PN-junction subcells of the laminated N PN-junction subcells, and N≥6; and
    the laminated N PN-junction subcells are divided into groups and each group of the laminated N PN-junction subcells has a different band gap; wherein each subcell in a same group has same band gap.

2. The multi junction laminated laser photovoltaic cell according to claim 1, wherein
    the light absorption layer in each of the laminated N PN-junction subcells further comprises a base region and an emitter region,
    the base region and the emitter region have identical band gaps, and
    the base region and the emitter region have a first conducting type and a second conducting type, respectively, wherein
        one of the first conducting type and the second conducting type is an n-type conducting type, and
        the other one of the first conducting type and the second conducting type is a p-type conducting type.

3. The multi junction laminated laser photovoltaic cell according to claim 1, wherein
    each of the laminated N PN-junction subcells comprises a back surface field layer, a base region, an emitter region and a window layer, wherein
        the back surface field layer, the base region, the emitter region and the window layer are successively arranged in a setting direction,
        the back surface field layer and the base region have a first conducting type,
        the emitter region and the window layer have a second conducting type, and
        each of the back surface field layer and the window layer does not absorb incident target laser.

4. The multi junction laminated laser photovoltaic cell according to claim 1, wherein
band gaps of the laminated N PN-junction subcells decrease in a direction away from a laser incidence side of the multi junction laminated laser photovoltaic cell; and
a difference between a photon energy of a target laser entering the multi-junction laminated laser photovoltaic cell and a band gap of a PN-junction subcell on the laser incidence side of the multi-junction laminated laser photovoltaic cell is less than 0.1 eV.

5. The multi junction laminated laser photovoltaic cell according to claim 1, wherein
the first tunnel junction comprises an $N^+$-type semiconductor material layer and a $P^+$-type semiconductor material layer, wherein
the $N^+$-type semiconductor material layer and the $P^+$-type semiconductor material layer are connected with an N-type layer and a P-type layer of the laminated two adjacent PN-junction subcells, respectively, and
each of the $N^+$-type semiconductor material layer and the $P^+$-type semiconductor material layer does not absorb incident target laser.

6. The multi junction laminated laser photovoltaic cell according to claim 1, wherein
the current spreading layer and the ohmic contact layer are successively arranged on the cell unit laminated body,
the ohmic contact layer is electrically connected with the upper electrode, and
the current spreading layer does not absorb incident target laser.

7. The multi junction laminated laser photovoltaic cell according to claim 1, wherein
the substrate is a conducting single crystal substrate connected with a bottom of the cell unit laminated body, and the conducting single crystal substrate is electrically connected with the lower electrode; and
a material of the conducting single crystal substrate comprises GaAs, InP or Ge.

8. The multi junction laminated laser photovoltaic cell according to claim 7, wherein
when a conducting type of the conducting single crystal substrate is different from a conducting type of a bottom layer of the cell unit laminated body, a second tunnel junction is inserted between the conducting single crystal substrate and the cell unit laminated body to switch the conducting type of the conducting single crystal substrate.

9. The multi junction laminated laser photovoltaic cell according to claim 7, wherein
the light absorption layer of each of the laminated N PN junction subcells consists of a AlGaAs material lattice-matched to GaAs or Ge substrates; or
the light absorption layer of each of the laminated N PN junction subcells consists of a InGaAsP material lattice-matched to InP substrates; or
the light absorption layer of each of the laminated N PN junction subcells consists of a InGaAlAs material lattice-matched to the InP substrates.

10. The multi-junction laminated laser photovoltaic cell according to claim 1, wherein
a thicknesses of each of absorption layers of the laminated N PN junction subcells in the cell unit laminated body allows a light current generated in each of the laminated N PN junction subcells to be the same when the multi junction laminated laser photovoltaic cell sufficiently absorbs incident target laser.

11. The multi-junction laminated laser photovoltaic cell according to claim 1, wherein
a light receiving surface of the multi junction laminated laser photovoltaic cell is provided with an antireflection film; and
the light receiving surface is a top surface of the multi-junction laminated laser photovoltaic cell.

12. The multi-junction laminated laser photovoltaic cell according to claim 9, wherein
a thicknesses of each of absorption layers of the laminated N PN junction subcells in the cell unit laminated body allows a light current generated in each of the laminated N PN junction subcells to be the same when the multi junction laminated laser photovoltaic cell sufficiently absorbs incident target laser.

* * * * *